(12) United States Patent
Isik (10) Patent No.: US 8,766,736 B2
(45) Date of Patent: Jul. 1, 2014

(54) METHODS OF FREQUENCY VERSUS TEMPERATURE COMPENSATION OF EXISTING CRYSTAL OSCILLATORS

(76) Inventor: Tacettin Isik, Saratoga, CA (US)

( * ) Notice: Subject to any disclaimer, the term of this patent is extended or adjusted under 35 U.S.C. 154(b) by 326 days.

(21) Appl. No.: 13/017,603

(22) Filed: Jan. 31, 2011

(65) Prior Publication Data

US 2011/0193600 A1 Aug. 11, 2011

Related U.S. Application Data

(60) Provisional application No. 61/300,430, filed on Feb. 1, 2010.

(51) Int. Cl.
*H03L 1/00* (2006.01)

(52) U.S. Cl.
USPC ......... 331/176; 331/1 R; 331/158; 331/177 R (58) Field of Classification Search
USPC .................. 331/158, 176, 1 R, 175, 182, 183
See application file for complete search history.

(56) References Cited

U.S. PATENT DOCUMENTS

| | | | |
|---|---|---|---|
| 4,453,834 A | 6/1984 | Suzuki | |
| 5,572,167 A * | 11/1996 | Alder et al. | 331/2 |
| 5,668,506 A * | 9/1997 | Watanabe et al. | 331/66 |
| 5,892,408 A * | 4/1999 | Binder | 331/44 |
| 6,373,314 B2 | 4/2002 | Oda | |
| 6,630,872 B1 | 10/2003 | Lanoue | |
| 6,674,332 B1 * | 1/2004 | Wunner et al. | 331/18 |
| 6,747,522 B2 * | 6/2004 | Pietruszynski et al. | 331/177 R |
| 6,833,764 B1 * | 12/2004 | Dean | 331/2 |
| 7,030,706 B2 | 4/2006 | Yao | |
| 7,403,078 B2 | 7/2008 | Routama et al. | |
| 7,583,157 B2 | 9/2009 | Sakurai | |
| 7,782,152 B2 * | 8/2010 | Darabi et al. | 331/177 V |
| 8,223,070 B2 | 7/2012 | Vasilyev | |
| 2007/0024386 A1 * | 2/2007 | Yamamoto | 331/158 |
| 2009/0115542 A1 * | 5/2009 | Nakamura et al. | 331/176 |

* cited by examiner

*Primary Examiner* — Joseph Chang
*Assistant Examiner* — Jeffrey Shin
(74) *Attorney, Agent, or Firm* — Law Office of Rodney LeRoy (57) ABSTRACT

Methods for compensating the existing crystal oscillator frequencies in extended temperature ranges. Utilizing existing crystal oscillators on any system design which may have quartz crystals with associated circuitry to deliver frequency or timing reference signals and increasing the accuracy of such by additional circuitry.

15 Claims, 14 Drawing Sheets

Prior Art

PRIOR ART

METHODS OF FREQUENCY VERSUS TEMPERATURE COMPENSATION OF EXISTING CRYSTAL OSCILLATORS

This application claims the early application benefit of USPTO provisional application U.S. 61/300,430 filed Feb. 01, 2010

REFERENCES CITED

U.S. Pat. Nos. 5,668,506, 4,453,834, 20070030084, 20060132254, 6,630,872, 20050122182, 20050122182, 20010048330, 20090262018

FIELD OF INVENTION

Present invention relates to highly stable frequency or timing signal generators without the need of any other reference. More specifically, present invention relates to making an existing crystal oscillators more stable by external excitation.

BACKGROUND OF THE INVENTION

As the traditional temperature stabilized crystal oscillators (TCXO) are gaining wide use of todays systems, board manufacturers prefer to attach a crystal to the integrated circuits (ICs) that they are using. These oscillators are usually not temperature compensated. Attaching temperature compensated crystal oscillators (TCXO) which is quite mature in its' development, may be expensive and may not be flexible enough due to the limited selection of frequencies. Cheaper solutions, such as low frequency real time clocks (RTC) with temperature compensation, do not always serve the purpose of achieving high frequency signal references. Besides, there is no feasible temperature compensation solution for voltage controlled crystal oscillators.

There are numerous inventions in the TCXO field. U.S. Pat. No. 5,668,506 gives a detailed information about the problems and solutions associated with TCXOs. In U.S. Pat. No. 4,453,834, a timepiece clock reference generator is stabilized with respect to temperature. US patent 20070030084 teaches different ways of frequency adjustment including capacitor switching. US patent 20060132254 brings more of an analog solution, U.S. Pat. No. 6,630,872 discloses an elegant digital one and US patent 20050122182 suggests a self calibration technique. It should be obvious to someone ordinary skilled in art that none of these inventions discusses about compensating or stabilizing an existing oscillator with respect to temperature. They are all using their own crystal oscillator which has crystal integrated or packaged together with the circuits that controls their frequency.

There is at least one US patent (20010048330) that is utilizing an existing TCXO, not a regular crystal oscillator, describes how to increase the accuracy of the frequency with the aid of an automatic frequency control (AFC). In this arrangement, inventor's purpose is not to stabilize the oscillator it self directly, but rather generate a clock signal out of a PLL system with VCO which may not have high quality signal.

In US patent 20090262018, a non-TCXO is used to generate a relatively arbitrary frequency. Since the invention is solving a frequency correction problem of satellite receiver for which a clock signal with much higher accuracy is available, a subsequent PLL system could be used to compensate the frequency.

BRIEF DESCRIPTION OF THE INVENTION

This invention uses a temperature compensation on an on-chip resonator that is separate than the main resonator to which external system refers, and synchronizes external resonator's frequency to the temperature compensated internal resonator's. Several methods that can be chosen based on the needs, are described. These methods bring the ability to select any crystal or resonator, based on desired frequency and frequency accuracy. It is possible to build an architecture that is following either external crystal or resonator's, or the internal resonator's frequency. The methods described in this invention provide minimal variation on the selected frequency within a certain temperature range.

DETAILED DESCRIPTION OF THE INVENTION

The description given here is to allow someone ordinary skilled in the art to build and use of the present invention in related applications. Variety of modifications on the embodiments described, may be apparent to one skilled in the art and general principles of the invention described here may be applicable to other embodiments. These other embodiments may be constructed using n-channel transistors instead of p-channel ones, or vice versa; bipolar ones instead of mos; different amplifier types instead of what is illustrated here; different digital circuits with similar functionality instead of what is suggested here; different type of oscillators or resonators in place of what is taken as an example here; different type of frequency adjustment techniques instead of what is described here; different construction topologies which functions similar to what is given here. Therefore, the scope of present invention should not be taken as limited to the particular embodiments illustrated and described herein, but widest scope consistent with the principal and novel features disclosed here.

Figure 1:
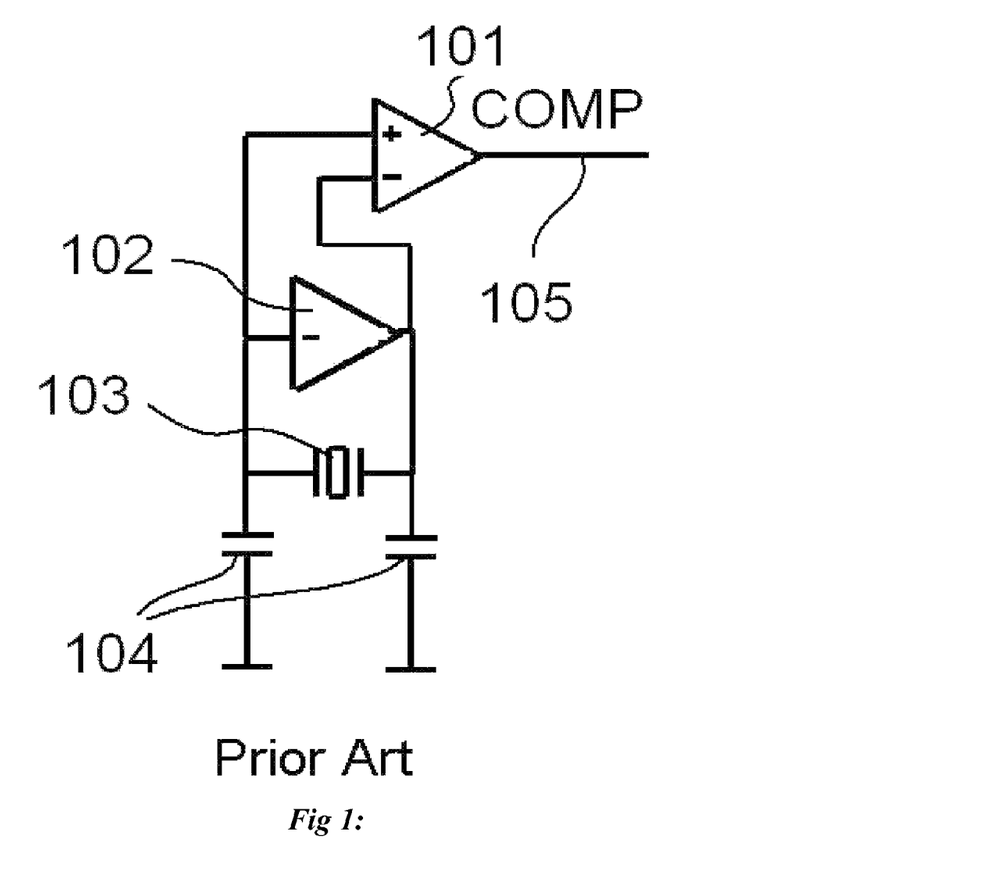
FIG. 1. Simplified schematic of a typical Pierce type crystal oscillator.

In FIG. 1, a basic crystal oscillator schematic is given. This illustrated form is known as Pierce type oscillator. When the quartz crystal 103 together with capacitors 104 excited by amplifier 102, constitute an oscillator. An analog comparator 101 switches the output 105 based on the polarity of the voltage across the crystal.

This form is a preferred by many oscillator makers due to its' reliability, well studied case, robustness etc. However, the invented methods explained here may apply to many different kind of oscillators and resonators. Any oscillator with high quality factor, in other words very narrow frequency band, also with frequency adjustment capability would serve the purpose.

Figure 2:
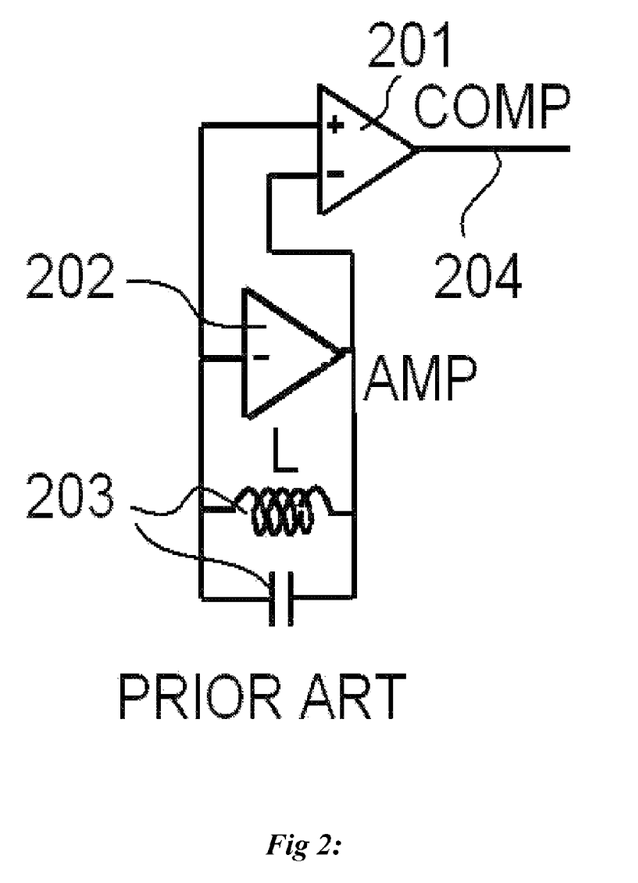
FIG. 2. Simplified schematic of an oscillator utilizing LC resonator.

For example, in FIG. 2, an LC tank oscillator is illustrated. The similarity should be visible to the someone ordinary skilled in the art. Similarly, amplifier 202 with LC tank 203 constitutes an oscillator and comparator 201 generates an output signal at output node 204. All it is needed to make any resonator or oscillator to be useful for this invention is that it should be arranged to be adjustable in either a digital or an analog fashion. These arrangements are well discussed in the literature as well as numerous patents.

Figure 3:
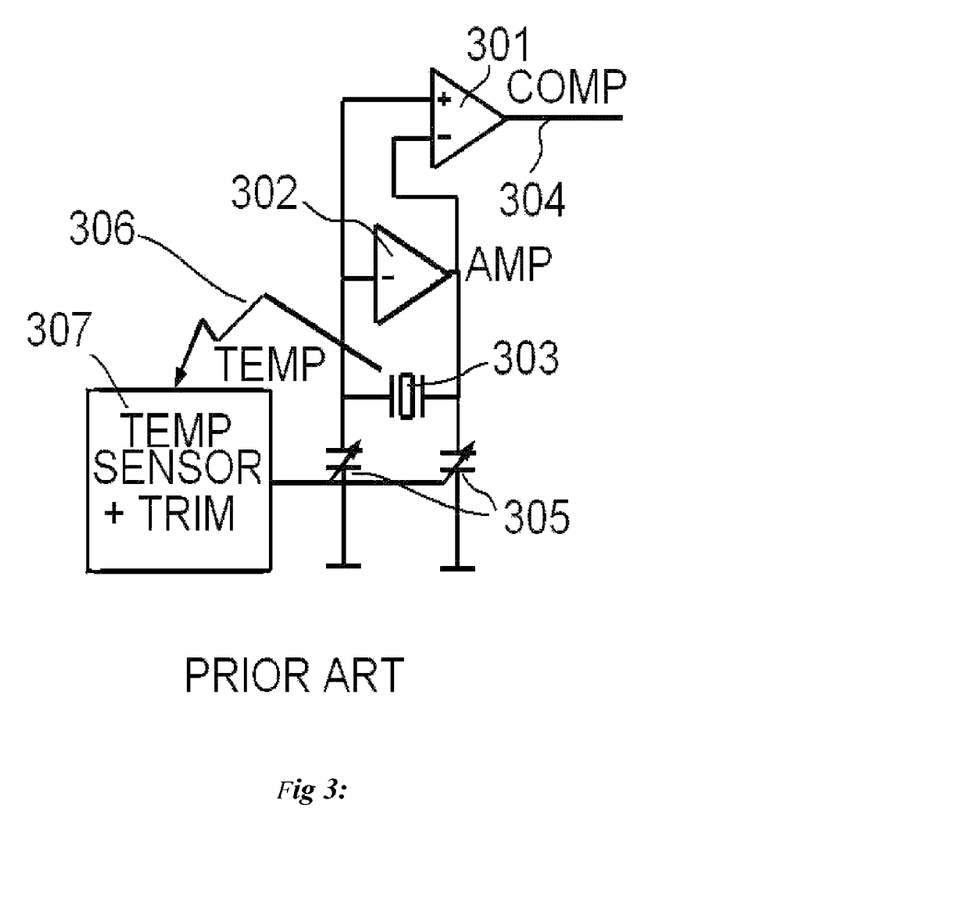
FIG. 3. Conceptual schematic representing a temperature compensated oscillator.

Referring to FIG. 3, a frequency adjustment is done by varying the capacitor 305 values. When a temperature measurement apparatus 307, which is also discussed in many articles and patents, is placed to detect the temperature 306 of the resonator and vary the capacitor values accordingly, in such a way that the variation on the nominal frequency of the resonator 303 within a certain temperature range can be reduced.

Figure 4:
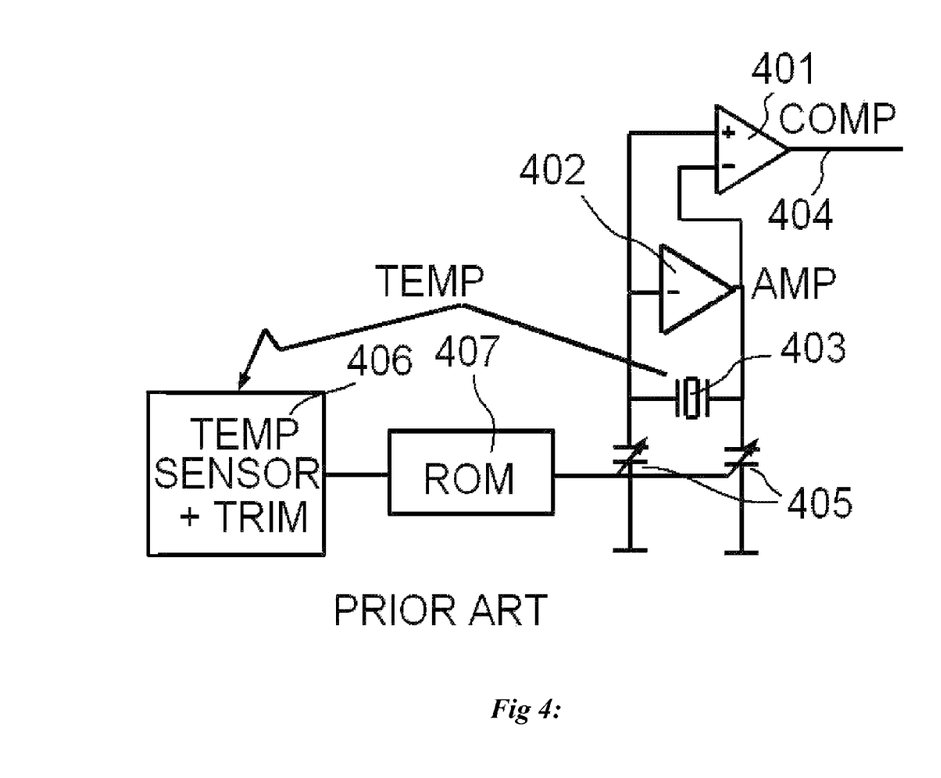
FIG. 4. Conceptual schematic representing a temperature compensated oscillator utilizing a ROM to reduce nonlinearities.

FIG. 4, shows similar arrangement, with additional circuit 407 to correct nonlinearities. Although this linearization circuit 407 can be many different forms, for the simplification, it is illustrated as Read Only Memory (ROM).

Figure 5:
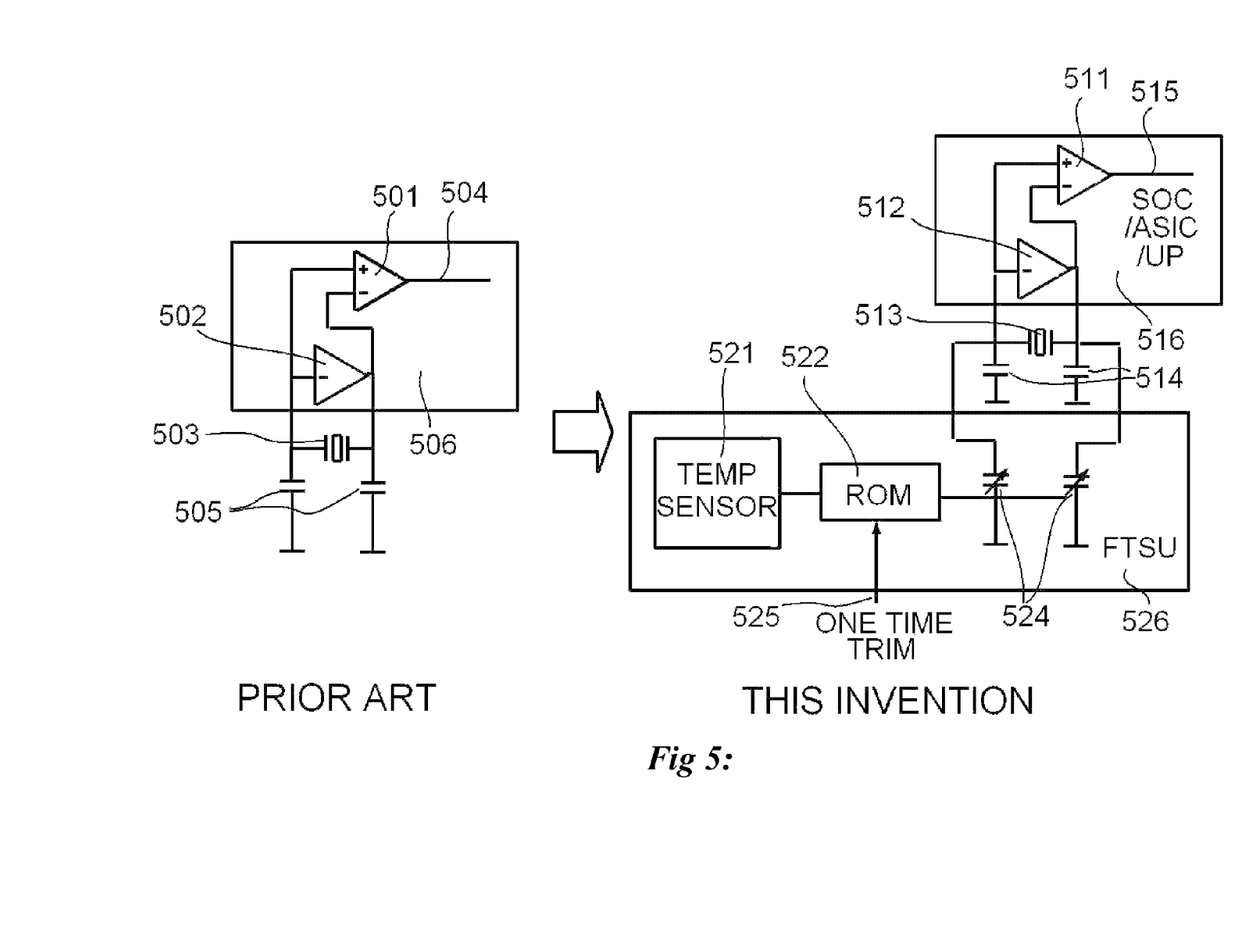
FIG. 5. Diagram illustrating basic concept of transforming existing oscillators to temperature compensated ones.

FIG. 5 illustrates the basic concept of transformation from conventional crystal oscillator to temperature compensated one by just adding Frequency-Temperature Stabilization Unit (FTSU) 526. This illustration overviews the invention described here. Essentially, amplifier 502, 512 comparator 501, 511, circuit 506, 516 containing these oscillator components, and the resonator 503, 513 remain exactly the same. Capacitance values of capacitors 504 reduced proper amount 514, and the difference is complemented by the ones 524 inside the FTSU. It should be obvious to the one ordinary skilled in the art that this arrangement with temperature sensor 521 and ROM 522, is very similar to the one shown in FIG. 4, however, the difference is that by just adding an FTSU to the existing system, one can achieve temperature invariant frequency reference without disturbing existing circuitry.

In conventional TCXO implementations where temperature sensor, resonator and the other elements packaged together, temperature compensation is done by knowing this togetherness is for lifetime and by using a one time programming operation during manufacturing phase. When FTSU is added on a system to work with an arbitrary crystal, the trimming operation must be done by the end user. Therefore One Time Trim interface 525, is added to FTSU in its' this simple form.

Figure 6:
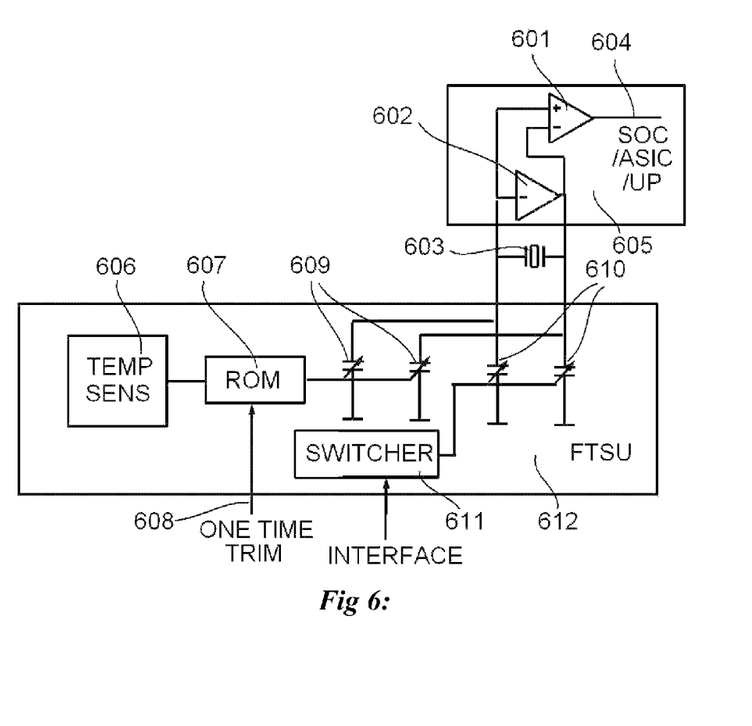
FIG. 6. Schematic shows that external capacitors are moved inside and used for range selection via digital interface.

Referring to FIG. 6, external capacitors are eliminated by using capacitors 610 inside the FTSU. They are also partitioned in such a way that a coarse trimming can be done with another interface and a capacitor switching mechanism 611. This method provides better control on frequency as well as resonator selection.

Figure 7:
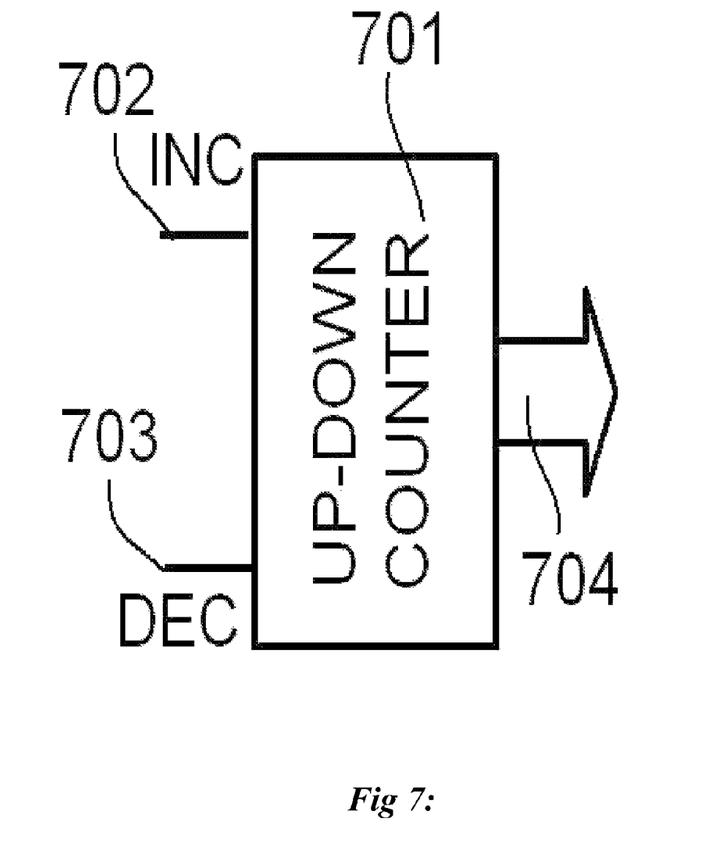
FIG. 7. Block representation of the switcher seen in FIG. 6 as a simple up-down counter.

One possible implementation of the switching mechanism is illustrated in FIG. 7. An up-down counter that is acting as a memory at the same time, is driven by inputs increment 702 and decrement 703 signals and holds the amount of the capacitor information at its' output 704.

Figure 8:
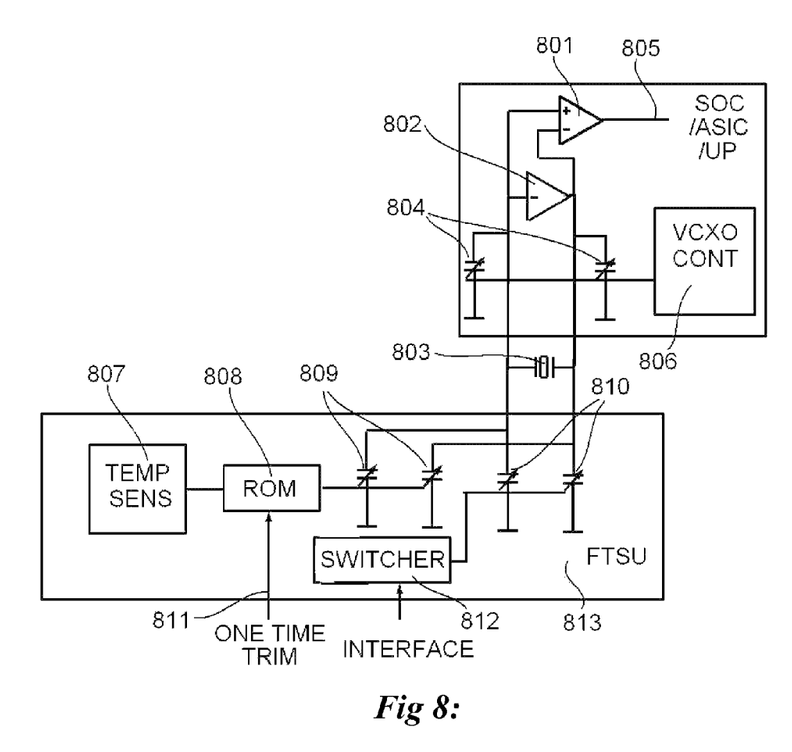
FIG. 8. Schematic illustrating temperature compensated VCXO working in open loop fashion.

In FIG. 8, FTSU 813 which is exactly same as what was illustrated in FIG. 6, is making VCXO to be temperature stabilized. For the sake of simplification, capacitor controlled VCXO topology is selected to be shown here. As a prior art, VCXO control block 806 switches the capacitors 804 to vary the frequency around its' nominal value. Unless such a VCXO is locked to another reference, nominal frequency would slide when the temperature changes. By adding FTSU, this temperature dependency can be eliminated. Since the designer of the VCXO optimized the amount of the capacitors, placing the FTSU will bring additional shift in the frequency. The solution to this problem is to use higher load capacitance resonator.

FTSU described above FIGS. 6 and 8 lacks of direct temperature feedback from external resonator. This feedback can be improved by special packaging or board design. Even with this weakness, frequency variation of the resonator would be much better than the case which does not use an FTSU.

Figure 9:
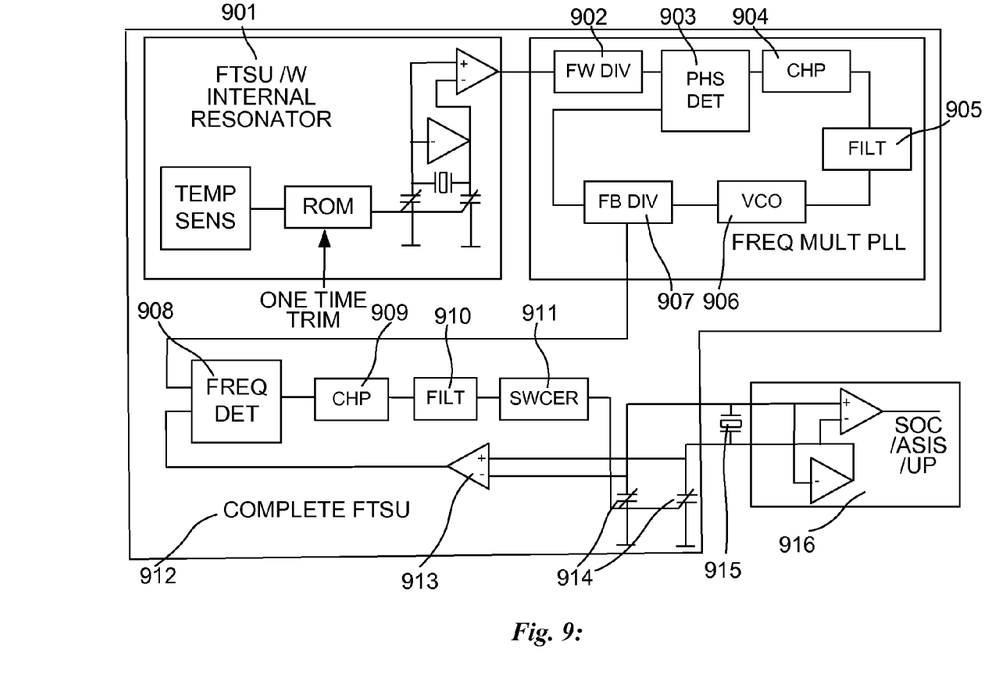
FIG. 9. Block diagram showing isolated temperature compensated internal oscillator accurately setting the external oscillator frequency by a PLL system.

In order to eliminate temperature feedback problem, arrangement illustrated in FIG. 9 can be used. An FTSU 901 with internal resonator is integrated with two cascaded phase locked loop (PLL) systems. First PLL with forward divider 902, phase detector 903, charge pump 904, loop filter 905, VCO 908, and a feedback divider 907, multiplies the frequency generated by internal FTSU 901 block, in such a way that external resonator's nominal frequency is matched. This is done by programming forward 902 and feedback 907 dividers which are built deep enough to give desired accuracy. Output of multiplier PLL that is tapped out of feedback divider 907, is fed to the secondary PLL's frequency detector 908. Frequency detector 908 compares the frequency of this signal and the signal obtained from external crystal 915 using a comparator 913. The frequency error signal coming out of frequency detector is then fed into usual PLL components, charge pump 909 and loop filter 910 which may be implemented as analog or digital methods. Finally, correction on the frequency is done by capacitor switching circuitry, based on this signal.

Since the internal FTSU has its' own temperature feedback, it can be trimmed to deliver repeatable flat frequency vs. temperature characteristics. When multiplication factor is chosen properly, even if the external resonator's frequency is drifted due to the temperature, complete FDSU 912 will bring it back to nominal frequency.

Figure 10:
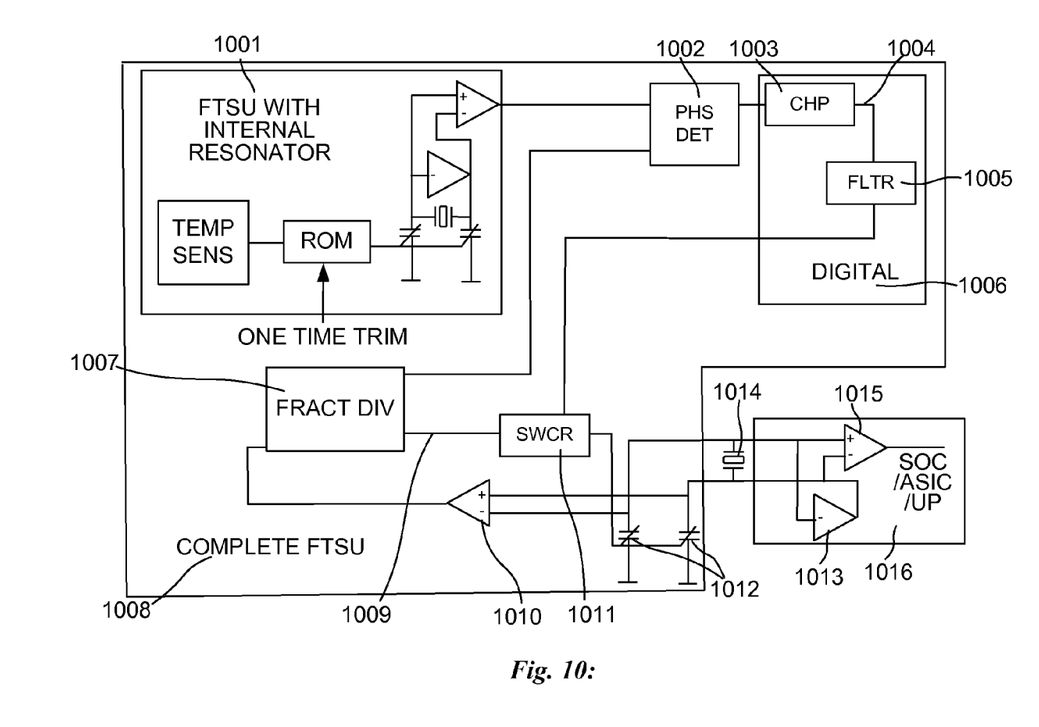
FIG. 10. Block diagram showing PLL system with VCO eliminated.

Referring to the FIG. 10, a simplification may be obvious to someone ordinary skilled in art can be described. In this arrangement, one of the PLL is eliminated by using a fractional divider 1007. With the assumption of frequency generated by internal FTSU 1001 is significantly lower than what external resonator gives, fractional divider can be programmed to divide external resonator's frequency down to internal FTSU's nominal frequency. The phase detector 1002 compares the phase and ultimately the frequency of these two signals and generates commands for increasing or decreasing the frequency of external resonator's via usual PLL components charge pump 1003, loop filter 1005 and a capacitor switcher 1011. It is also obvious to someone ordinary skilled in the art that these components can be done in entirely digital fashion 1008. A reset signal 1009 is generated by fractional divider to restart switcher 1011 when a refresh occurs at every fractional divider cycle. This is to ensure abrupt changes on the frequency correction not to occur.

Method disclosed in FIG. 10 has clear advantages over the one in FIG. 9. Most important ones of these advantages are the simplification and the power consumption.

Figure 11:
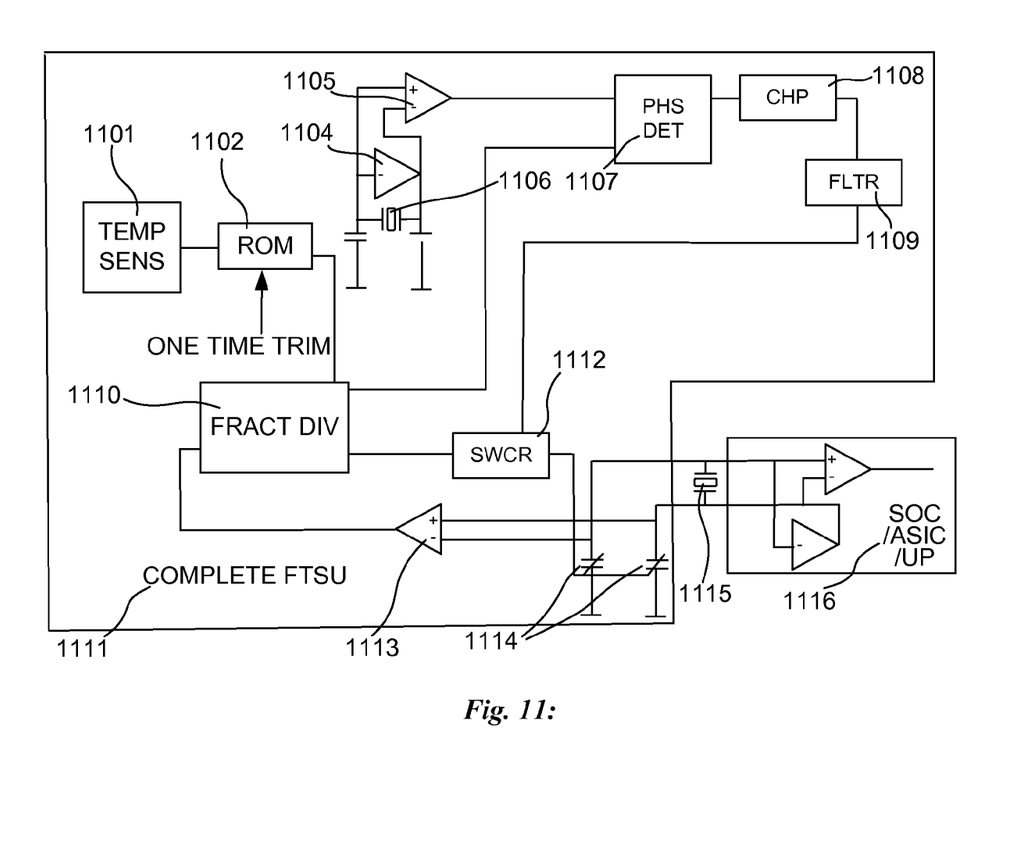
FIG. 11. Block diagram showing how compensation is done adjusting fractional divide value rather than switching.

FIG. 11 illustrates even further simplification. In this arrangement, internal reference is free running oscillator without any temperature compensation on its' frequency 1103, 1106, 1104, 1105. The compensation is done by reprogramming fractional divider 1110, every time a temperature change is detected by sensor 1101 and linearizer 1102. This method is useful when internal reference is not needed for other purposes.

Figure 12:
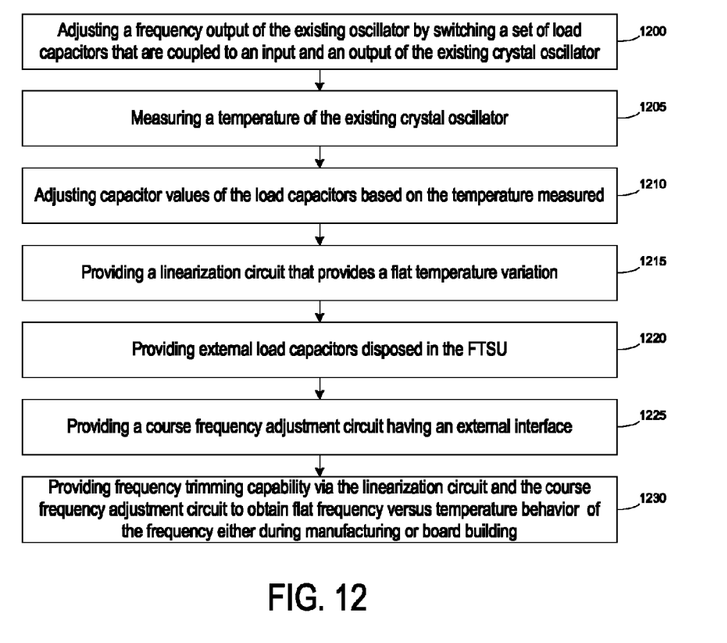
FIG. 12 is a high-level flow diagram of a method for converting a traditional and existing crystal oscillator into a temperature compensated crystal oscillator by adding a frequency temperature stabilization unit (FTSU) to the existing crystal oscillator.

FIG. 12 is a high-level flow diagram of a method for converting a traditional and existing crystal oscillator into a temperature compensated crystal oscillator by adding a frequency temperature stabilization unit (FTSU) to the existing crystal oscillator. The high-level flow diagram represents an example embodiment. At 1200, a the a frequency output from the crystal oscillator is adjusted by switching load capacitors of the crystal oscillator in and out of the FTSU. At 1205, the temperature of the existing crystal oscillator is measured. At 1210 capacitor values of the load capacitors are adjusted based on the temperature of the existing crystal oscillator. At 1215, an output from a linearization circuit (e.g., ROM 808) is applied to capacitors of the FTSU for further adjusting the output from the existing crystal oscillator to make a temperature variation of the output relatively flat. At 1220, load capacitors are provided inside the FTSU to provide a coarse frequency adjustment circuit interfaced outside of the FTSU, step 1225. At 1230, trimming capability is provided to obtain a relatively flat frequency versus temperature behavior. Trimming can be applied during manufacturing or board building.

Figure 13:
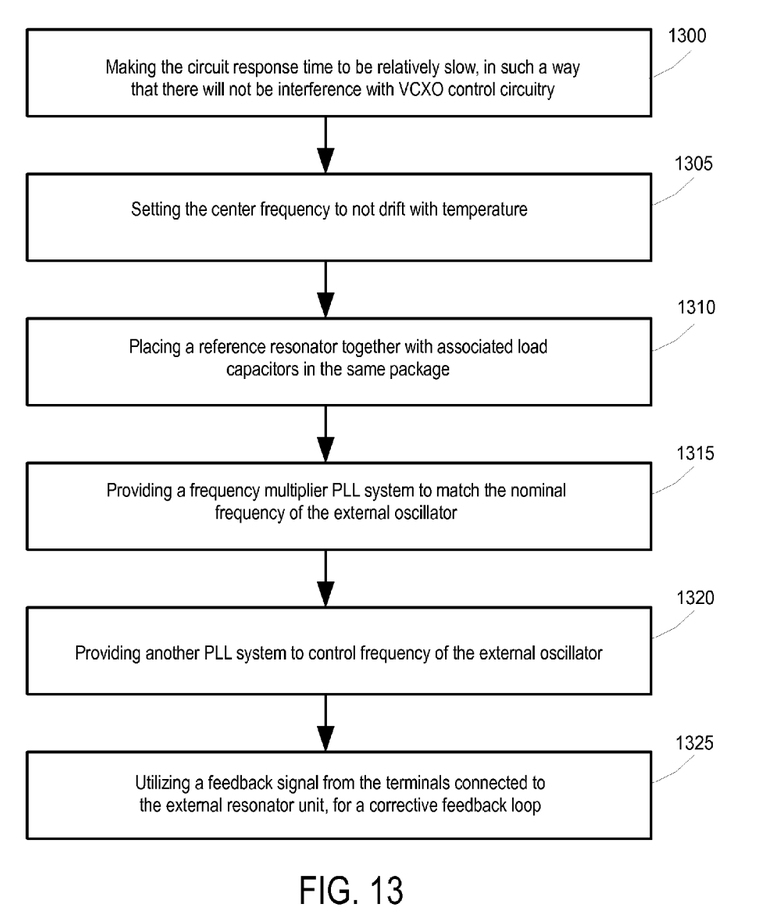
FIG. 13 is a high-level flow diagram of a method for converting a traditional and existing voltage controlled crystal oscillators (VCXOs) into a temperature compensated VCXO and for adjusting a frequency of a signal output from and the VCXO. The high-level flow diagram represents an example embodiment

FIG. 13 is a high-level flow diagram of a method for converting a traditional and existing voltage controlled crystal oscillators (VCXOs) into a temperature compensated VCXO and for adjusting a frequency of a signal output from and the VCXO. The high-level flow diagram represents an example embodiment. At 1300, a frequency temperature stabilization unit (FTSU) is provided that has a relatively slow response time so as not to interfere with VCXO control circuitry of the VCXO. At 1305, a center frequency is set so that the center frequency does not drift with temperature. At 1310 a reference resonator and associated load capacitors are provided together in a package. At 1315, a frequency multiplier phase locked loop system is provided to match with the external oscillator's nominal frequency. At 1320, another phase locked loop system is provided to control the external oscillator's frequency. At 1325, a feedback signal from terminals of the external oscillator is used to create and control the feedback path.

Figure 14:
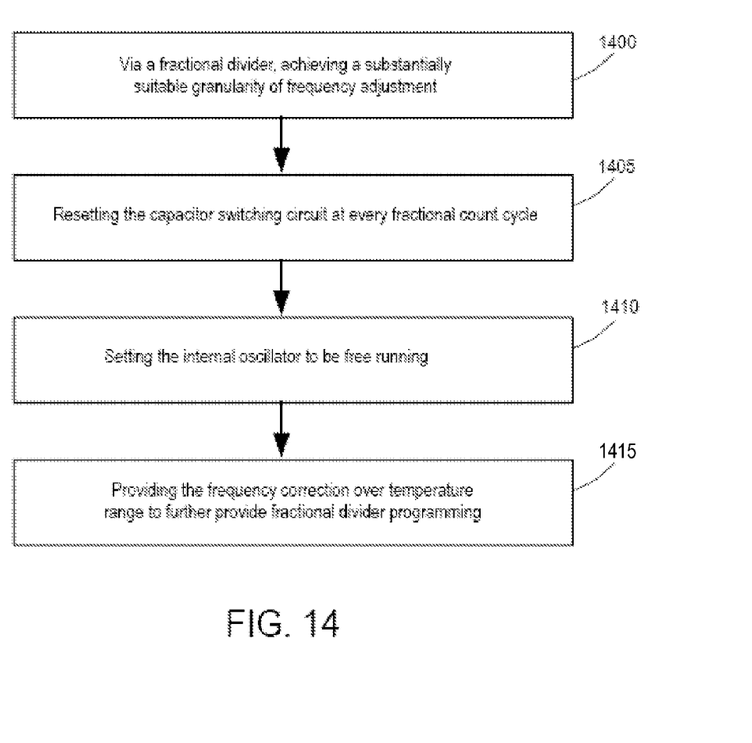
FIG. 14 is a high-level flow diagram of a method for converting a traditional and existing voltage controlled crystal oscillators (VCXOs) into a temperature compensated VCXO and for adjusting a frequency of a signal output from and the VCXO.

FIG. 14 is a high-level flow diagram of a method for converting a traditional and existing voltage controlled crystal oscillators (VCXOs) into a temperature compensated VCXO and for adjusting a frequency of a signal output from and the VCXO. The high-level flow diagram represents an example embodiment. At 1400, via the fractional divider, a substantially suitable granularity of frequency adjustment is achieved. At 1405, the capacitor switching circuit is reset at every fractional count cycle. At 1410, the internal oscillator is set to be free running At 1415, the frequency correction is provided over a temperature range to further provide fractional divider programming.

I claim:

1. An adjustment circuit for adjusting a frequency of an output of an external crystal oscillator, the adjustment circuit comprising:
    an internal resonator that includes a temperature sensor and a frequency linearization circuit that is responsive to a temperature measured by the temperature sensor;
    a primary PLL coupled to the internal resonator and configured to generate an output, which has a frequency that matches a nominal frequency of the external crystal oscillator; and
    a secondary PLL coupled to the primary PLL and configured to receive the output and receive a feedback from the external crystal oscillator to correct the frequency of the output from the external crystal oscillator based on the temperature.

2. The adjustment circuit of claim 1, wherein the secondary PLL includes a frequency detector, a charge pump, a filter, and a switcher, which is coupled to the external crystal oscillator.

3. The adjustment circuit of claim 1, wherein the secondary PLL is configured to correct the frequency of the output from the external crystal oscillator based on the temperature and the output from the external crystal oscillator.

4. The adjustment circuit of claim 1, wherein the frequency linearization circuit includes an external interface configured to receive an input for trimming the frequency of a reference signal generated by the frequency linearization circuit.

5. The adjustment circuit of claim 1, wherein the temperature sensor is configured to determine a temperature of the internal resonator for adjusting a frequency of a reference signal generated by the internal resonator based on the temperature, and wherein the internal resonator is configured to provide the reference signal to the first PLL.

6. The adjustment circuit of claim 5, wherein the first PLL is configured receive the reference signal from the internal resonator and adjust the frequency of the reference signal to match the nominal frequency of the external crystal oscillator.

7. The adjustment circuit of claim 5, wherein the temperature sensor is configured to generate a control signal based on the temperature sensed by the temperature sensor and transmit the control command to the linearization circuit for adjusting the frequency of the reference signal.

8. The adjustment circuit of claim 5, wherein the internal resonator includes a crystal oscillator coupled to the linearization circuit and the crystal oscillator is configured to generate the reference signal.

9. An adjustment circuit for adjusting a frequency of an output of an external crystal oscillator, the adjustment circuit comprising:
    a free running internal resonator;
    a temperature sensor coupled to the free running internal resonator and that includes a frequency linearization circuit that is configured to adjust a frequency of a reference signal generated by the free running internal resonator based on a temperature of the free running internal resonator sensed by the temperature sensor;
    a fractional PLL coupled to the free running internal resonator and the temperature sensor, wherein:
        the fractional PLL is configured to receive the reference signal generated by the free running internal resonator and frequency adjusted by the temperature sensor and the frequency linearization circuit;
        the fractional PLL includes a feedback configured to receive the output of the external crystal oscillator, and the fractional PLL is configured to generate an output that controls the frequency of the output of the external crystal oscillator based on the temperature, the output of the external crystal oscillator received at the feedback, and a free running signal received from the free running internal resonator.

10. The adjustment circuit of claim 9, wherein the fractional PLL includes a fractional divider configured to control dividing down the frequency of the output of the external crystal.

11. An adjustment circuit for adjusting a frequency of an output of an external crystal oscillator, the adjustment circuit comprising:
  an internal resonator having a temperature sensor and a frequency linearization circuit that is responsive to a temperature measured by the temperature sensor;
  a fractional PLL coupled to the internal resonator, wherein:
    the fractional PLL is configured to divide down the frequency of the output of the external crystal oscillator to a frequency of an output of the internal resonator,
    includes a feedback configured to receive the output of the external crystal oscillator, and
    configured to generate an output that controls the frequency of the output of the external crystal oscillator based on the temperature.

12. The adjustment circuit of claim 11, wherein the fractional PLL includes a fractional divider configured to control dividing down the frequency of the output of the external crystal.

13. The adjustment circuit of claim 12, wherein the fractional PLL includes:
  a comparator coupled to the fractional divider and configured to receive the output of the external crystal oscillator and provide a frequency signal for the output of the external crystal oscillator to the fraction divider,
  a phase detector, which includes a first input coupled to an output of the fractional divider and includes a second input coupled to the output of the internal resonator,
  a switcher coupled to an output of the adjustment circuit and configured to generate a control signal to control a frequency of the output of the external crystal oscillator, and
  a filter coupled between an output of the phase detector and the switcher.

14. The adjustment circuit of claim 11, wherein the fractional PLL is configured to generate the output that controls the frequency of the output of the external crystal oscillator based on the temperature and based on the output of the external crystal oscillator received via the feedback.

15. The adjustment circuit of claim 14, wherein the temperature sensor is configured to determine a temperature of the internal resonator for adjusting a frequency of a reference signal generated by the internal resonator based on the temperature, and wherein the internal resonator is configured to provide the reference signal to the fractional PLL.

* * * * *